(12) United States Patent
Mortini

(10) Patent No.: US 8,980,537 B2
(45) Date of Patent: Mar. 17, 2015

(54) PHOTOLITHOGRAPHY METHOD USING A CHEMICALLY-AMPLIFIED RESIST

(75) Inventor: Benedicte Mortini, Meylan (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 142 days.

(21) Appl. No.: 13/603,225

(22) Filed: Sep. 4, 2012

(65) Prior Publication Data

US 2013/0059254 A1    Mar. 7, 2013

(30) Foreign Application Priority Data

Sep. 5, 2011  (FR) ...................... 11 57839

(51) Int. Cl.
  *G03F 7/38* (2006.01)
  *G03F 7/038* (2006.01)
  *G03F 7/039* (2006.01)

(52) U.S. Cl.
  CPC ............... *G03F 7/38* (2013.01); *G03F 7/0382* (2013.01); *G03F 7/0392* (2013.01)
  USPC .......................................... 430/325; 430/322

(58) Field of Classification Search
  CPC ........ G03F 7/38; G03F 7/0382; G03F 7/0392
  USPC ................................................. 430/322, 325
  See application file for complete search history.

(56) References Cited

U.S. PATENT DOCUMENTS

| 6,107,002 | A  | * | 8/2000 | Holscher et al. | .............. | 430/313 |
| 6,316,162 | B1 |   | 11/2001 | Jung et al. |
| 2004/0007382 | A1 |   | 1/2004 | Mortini |

FOREIGN PATENT DOCUMENTS

JP    2004-87628 A    3/2004

* cited by examiner

*Primary Examiner* — Kathleen Duda
(74) *Attorney, Agent, or Firm* — Seed IP Law Group PLLC

(57) ABSTRACT

A photolithography method, including the steps of: S1) depositing, on the upper surface of a wafer, a chemically-amplified resist; S2) exposing the resist to a sensitizing radiation through a mask, to generate acid compounds in the exposed regions; S3) heating the resist, to have the acid compounds react with dissolution-inhibiting groups; and S5) developing the resist; and including, after step S3, a step of neutralization, S4, of the acid compounds which have not reacted at step S3.

12 Claims, 3 Drawing Sheets

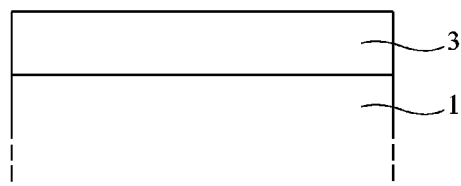
Fig 1A
*(Prior Art)*
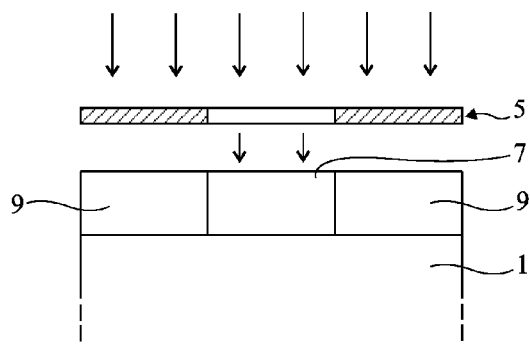
Fig 1B
*(Prior Art)*
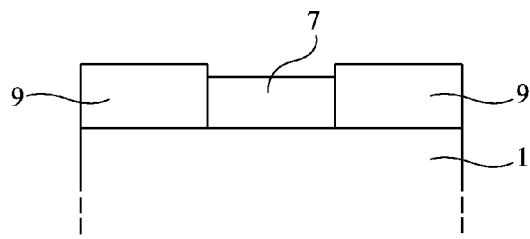
Fig 1C
*(Prior Art)*
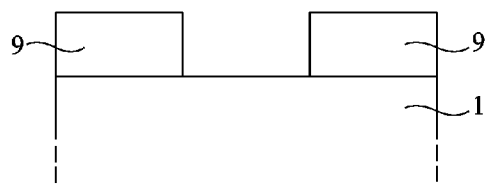 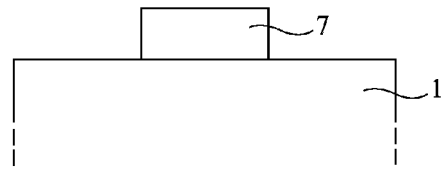
Fig 2A　　　　　　　　　Fig 2B
*(Prior Art)*　　　　　　　*(Prior Art)*

PHOTOLITHOGRAPHY METHOD USING A CHEMICALLY-AMPLIFIED RESIST

BACKGROUND

1. Technical Field

The present disclosure relates to a photolithography method, and more specifically to a photolithography method using a chemically-amplified resist.

2. Discussion of Related Art

In certain integrated circuit manufacturing technologies corresponding to particularly high integration levels, sensitizing radiations in the deep ultraviolet range at a wavelength smaller than or equal to 250 nm have to be used during photolithography steps. For example, KrF excimer lasers are used for 248-nm wavelengths and ArF excimer lasers are used for 193-nm wavelengths. Current resists, for example resists of novolak/naphtoquinone diazide type, cannot be used for such wavelengths since they absorb the radiation and the resist is not sensitized across its entire thickness. A solution is to use chemically-amplified resists.

Chemically-amplified resists are materials capable of generating an acid compound in regions exposed to a radiation, for example, an ultraviolet radiation, and to change solubility in a development solution, by reaction with the acid compound, in exposed regions with respect to non-exposed regions.

Chemically-amplified resists comprise polymer chains intrinsically soluble in a determined development solution, generally an alkaline development solution. Resists soluble in an alkaline development solution for example comprise polymer chains supporting —OH or —COOH functions. The polymer chains are made insoluble in the development solution by dissolution inhibitors incorporated in the resist. Such dissolution inhibitors for example are groups bonded to the polymer chains by acid functions —OH and —COOH of these chains. The dissolution-inhibiting groups for example are hydrophobic groups in the case where the development solution is an aqueous solution. Chemically-amplified resists further comprise precursors of compounds capable of deactivating dissolution inhibitors. Such resists are called chemically-amplified resists since a same precursor produces a compound capable of deactivating several dissolution inhibitors.

In the case where a KrF excimer laser is used as sensitizing radiation source, resists having as a backbone a polyhydroxy styrene functionalized by lateral groups are generally used. In the case where a radiation source with a sensitization of lower wavelength is used, for example, an ArF excimer laser, resists having an alicyclic, monocyclic, or polycyclic hydrocarbon structure are preferably used, compounds comprising aromatic groups and many unsaturated bonds having too high a radiation absorption to enable the creation of high-resolution patterns.

The precursors of compounds capable of deactivating dissolution inhibitors for example are acid compound precursors.

Such chemically-amplified resists are for example formed of 95% of polymer chains and 5% of acid compound precursors. Acid compound precursors for example are onium salts, for example triphenylsulfonium salts or iodonium salts. Sulfonates may also be used, for example, imidosulfonates or oximesulfonates, diazodisulfones, disulfones, or o-nitrobenzyl sulfonates.

FIGS. 1A-1C and 2A-2B illustrate successive steps of a conventional photolithography method using a chemically-amplified resist of the above-described type.

FIG. 1A is a cross-section view illustrating a step of deposition, on the upper surface of a wafer 1, of a chemically-amplified resist layer 3. The resist deposition step may be preceded by a step of deposition of a coupling agent, for example, hexamethyldisilazane (HMDS), intended to improve the bonding of resist 3 to the upper surface of wafer 1. The resist deposition is then performed by centrifugation of the resist dissolved in a solvent. Once deposited, the resist is dried and submitted to a heating enabling to increase its density and to relax the stress present therein.

After the resist has been deposited, as illustrated in FIG. 1B, the resist is exposed to a sensitizing radiation. The resist exposure is performed through a mask 5 enabling to define exposed regions 7 and non-exposed regions 9 of the resist. In exposed regions 7 of the resist, the sensitizing radiation causes the generation of acid compounds by the acid compound precursors.

After the resist exposure, at the step illustrated in FIG. 1C, the resist is heated. The heating of the resist causes a reaction between the acid compounds, generated during the exposure step, and the polymer chain dissolution-inhibiting groups. The resist heating temperature to cause the reaction between acid compounds and dissolution-inhibiting groups depends on the group activation energy. This temperature is generally greater than approximately 90° C., and preferably ranges between 100 and 140° C. An acid compound for example reacts with a few hundreds of dissolution-inhibiting groups. When attacked by acid compounds, the dissolution-inhibiting groups separate into polymer chains. The reaction causes a degassing and a rearrangement of the polymer chains, which results in a decrease in the thickness of exposed regions 7 of the resist, as shown in FIG. 1C. During this resist heating step, the polymer chains, partially or totally freed of their dissolution-inhibiting groups, become soluble again into the alkaline development solution.

During the step of heating after exposure, acid compounds diffuse towards the non-exposed resist regions. To limit this parasitic diffusion phenomenon, a solution is to use chemically-amplified resists having dissolution inhibiting groups of low activation energy. The resist heating temperature can thus be decreased, for example, to a value approximately ranging from 80 to 90° C.

It should be noted that the acid compounds photogenerated in the resist regions exposed to the sensitizing radiation must absolutely not be neutralized before having been able to play their dissolution inhibitor deactivation role. All possible precautions are thus taken to avoid for the exposed and non-developed resist to be contaminated by alkaline compounds, amines, or organic compounds. The steps illustrated in FIGS. 1A to 1C are thus carried out under an atmosphere protected from such contaminants. In particular, these steps are carried out in photolithography equipment capable of filtering compounds such as alkaline compounds, amines, or organic compounds. The content of such compounds in the atmosphere is further strictly controlled in the clean room area where the photolithography equipment is installed, and where wafers covered with exposed and non developed resist may be momentarily stored.

A next step comprises developing the resist. This may performed according to one or the other of the variations illustrated in FIGS. 2A and 2B.

In the case of FIG. 2A, the resist has been developed in an aqueous alkaline tetramethyl ammonium hydroxide (TMAH) solution, for example, at a 2.38% concentration. The polymer chains of the exposed regions have recovered, after the resist heating, their solubility in the alkaline development solution.

After development, only non-exposed resist regions 9 remain on the upper surface of the wafer, exposed regions 7 having been removed.

In the case of FIG. 2B, the resist has been developed in an organic solvent, for example, a solvent comprising methyl-n-amyl ketone or butyl acetate. In this case, the lack of solubility of the polymer chains having recovered their —OH and —COOH functions in an organic solvent is used. The polymer chains of the non-exposed regions are not soluble in an aqueous solution, since they substantially support as many dissolution inhibiting groups as originally, but are soluble in an organic solution. The exposed regions are not soluble in an organic solution. As illustrated in FIG. 2B, after the step of development of the resist by an organic solvent, only exposed regions 7 of the resist then remain on the upper surface of the wafer.

U.S. Patent Application Publication No. 2004007382 describes a photolithography method of the above-described type using a chemically-amplified resist and comprising two additional steps after the step of resist development by an aqueous solution. After development, the resist regions which were protected by the mask on exposure to the sensitizing radiation remain at the surface. The first additional step comprises exposing the resist to a second sensitizing radiation, without using any mask. The second additional step comprises neutralizing the acid compounds generated in the resist at the second exposure thereof. These two additional steps enable to avoid the flowing of the resist after development, in etching and ion implantation steps during which the wafer is brought to a temperature capable of reactivating the diffusion of residual photogenerated acid compounds and their reaction with dissolution-inhibiting groups, which makes the resist less resistant. Such a resist flow may result in altering the size of the etched or implanted patterns.

The use of chemically-amplified resists supporting dissolution-inhibiting groups of low activation power, to limit the parasitic diffusion of acid compounds during the heating step however raises a new issue. Indeed, in such resists, acid compounds are capable of reacting with dissolution-inhibiting groups in the absence of any heating, that is, at ambient temperature, even if this decreases the reaction kinetics. Now, a non-negligible time that cannot be shortened always elapses between the end of the heating step and the beginning of the development step. Such delays between steps within the photolithography equipment may result in a parasitic diffusion of acid compounds. Further, for practical reasons, associated with the organization of an integrated circuit manufacturing plant, several hours, or even several days, may elapse between the end of the step of heating after exposure and the beginning of the development step. Acid compounds then risk continuing to react in uncontrolled fashion with dissolution-inhibiting groups, even in the absence of any heating. As a result, the size of the exposed regions of the resist layer risks becoming too small with respect to the expected size. Another consequence is that acid compounds diffuse towards the non-exposed regions of the resist, and react in these regions with dissolution-inhibiting groups. The longer the waiting time before development, the less the dimensions of the resist patterns remaining on the upper surface of the wafer will correspond to the dimensions of the patterns of the initial mask. If the differences between dimensions of the resist patterns and the dimensions of the mask patterns are too large, for example, if these differences correspond to more than 10% of the dimensions of the smallest patterns of the mask, all the steps of the photolithography method will have to be resumed.

There thus is a need for a photolithography method using chemically-amplified resists providing resist pattern dimensions after development which substantially corresponds to the dimensions defined on the mask used during the resist exposure, or dimensions taking into account a given intentional dimensional shift between the dimensions defined on the mask and those reproduced in the resist, whatever the delay or the waiting delay between the end of the heating step after exposure and the beginning of the development step.

BRIEF SUMMARY

Thus, an embodiment provides a photolithography method using a chemically-amplified resist enabling to prevent reactions between acid compounds and dissolution-inhibiting groups of the polymer chains, as soon as the step of heating after exposure is over and while waiting for the development step.

An embodiment provides a photolithography method, comprising the steps of: S1) depositing, on the upper surface of a wafer, a chemically-amplified resist; S2) expositing the resist to a sensitizing radiation through a mask, to generate acid compounds in the exposed regions; S3) heating the resist, to have the acid compounds react with dissolution-inhibiting groups; and S5) developing the resist; and comprising, after step S3, a step of neutralization, S4, of the acid compounds which have not reacted at step S3.

According to an embodiment, a given duration extends between the end of step S3 and the beginning of step S5, and neutralization step S4 is implemented within a short delay as compared with said given duration.

According to an embodiment, neutralization step S4 comprises placing of resist-coated wafer in an environment comprising vapors of an alkaline compound.

According to an embodiment, the alkaline compound belongs to the group comprising amines and compounds of silazane and silazane derivative type.

According to an embodiment, at neutralization step S4, the resist is taken to a temperature lower than the maximum temperature reached by the resist on heating at step S3.

According to an embodiment, at step S3, the maximum temperature reached by the resist ranges between 80 and 90° C. and neutralization step S4 is carried out at ambient temperature.

According to an embodiment, neutralization step S4 is implemented within a delay shorter than 3 minutes after the end of step S3 for from 10 seconds to 5 minutes.

According to an embodiment, steps S1 to S3 and step S5 are carried out under a protected atmosphere.

According to an embodiment, the method described hereabove further comprises, before the resist deposition step, S1, a step of deposition of a coupling agent on the upper surface of the wafer.

According to an embodiment, the coupling agent is hexamethyldisilazane.

The foregoing and other features and advantages will be discussed in detail in the following non-limiting description of specific embodiments in connection with the accompanying drawings.

BRIEF DESCRIPTION OF THE SEVERAL VIEWS OF THE DRAWINGS

FIGS. 1A-1C and 2A-2B, previously described, are cross-section views illustrating successive steps of a photolithography method using a chemically-amplified resist;

For clarity, the same elements have been designated with the same reference numerals in the different drawings and, further, as usual in the representation of integrated circuits, the various drawings are not to scale.

DETAILED DESCRIPTION

The applicant provides a photolithography method using a chemically-amplified resist, enabling to avoid, in the case where a long time elapses between the end of the step of heating after exposure and the beginning of the development step, problems of acid compound diffusion outside of the exposed regions and of uncontrolled reaction of acid compounds with dissolution-inhibiting groups grafted on the lateral chains of the used polymers.

Figure 5:
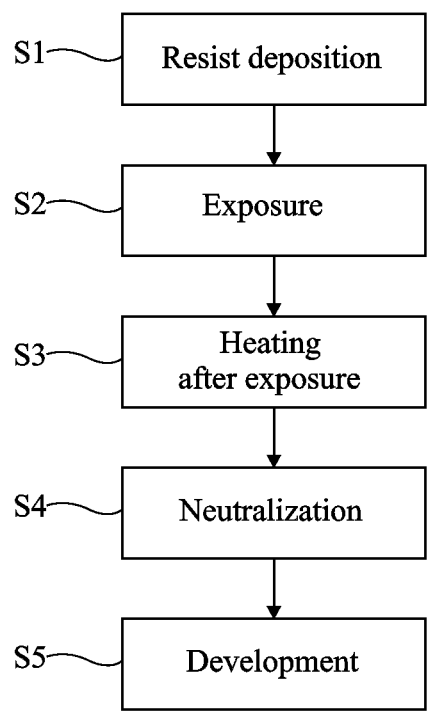
FIG. 5 is a synoptic diagram of the steps of a photolithography method.

The different steps of such a photolithography method are illustrated in FIGS. 3A-3D and 4A-4B and are summarized in the flow diagram of FIG. 5.

Figure 3A:
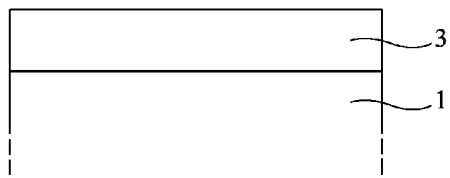
FIGS. 3A-3D and 4A-4B are cross-section views illustrating successive steps of a photolithography method using a chemically-amplified resist.
Figure 3B:
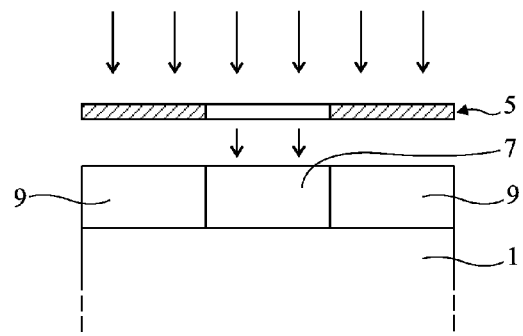
Figure 3C:
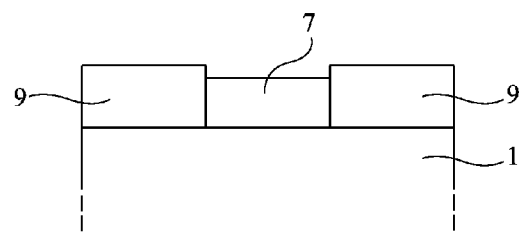

Steps S1 to S3 illustrated in FIGS. 3A to 3C resume the steps previously described in relation with FIGS. 1A to 1C.

At a step S4, implemented little after the end of the step of heating after exposure, the acid compounds which have not reacted at the step of heating after exposure are totally and rapidly neutralized.

Figure 3D:
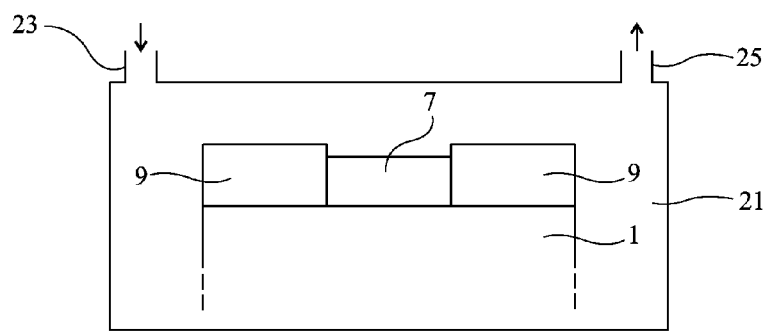
Figure 4A:
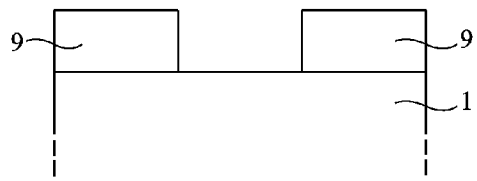
Figure 4B:
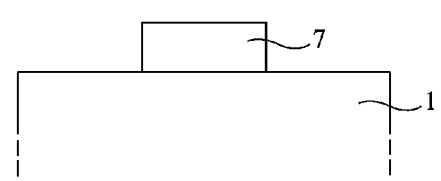

As illustrated in FIG. 3D, this neutralization step can be carried out in a closed chamber 21. A carrier gas, for example, nitrogen, is bubbled through a tank containing a dissolved alkaline compound, so that a portion of the alkaline compound evaporates and is carried by the carrier gas. Vapors of the alkaline compound are circulated in chamber 21 containing wafer 1 coated with resist, between an inlet 23 and an outlet 25. The alkaline compound then diffuses into regions 7 and 9 of the resist, and neutralizes the acid compounds therein. Alkaline compounds formed of small molecules will preferably be used, to ease the diffusion of the alkaline compound vapors across the entire thickness of the resist.

The neutralization step is preferably carried out at ambient temperature, or at least at a temperature lower than the maximum temperature reached by the resist in step S3 of heating after exposure. Thus, any reaction between acid compounds and dissolution-inhibiting groups before the full neutralization of acid compounds is limited. The duration of the neutralization step for example approximately ranges from a few seconds to a few minutes, that is, the neutralization step has a duration comparable to that of the other steps of the photolithography method. The alkaline compound for example is ammonia, an amine, a compound of silazane or silazane derivative, for example, hexamethyldisilazane (HMDS), a compound of pyrrolidone or pyrrolidone derivative, for example, N-methyl pyrrolidone, or again a mixture comprising some of these compounds.

It should be noted that modules of same type as neutralization chamber 21, that is, coupling agent deposition modules, are already provided in photolithography equipments. Installing a neutralization chamber such as chamber 21 in the immediate vicinity of equipment intended to implement the steps of FIGS. 3A to 3C thus is easy. Thus, the neutralization step may be implemented very rapidly after the end of the heating step (step S3), for example, within a maximum delay of 15 minutes, for example, within a delay shorter than 3 minutes, or even 1 minute. The alkaline compound used to neutralize the acid compounds for example is hexamethyldisilazane (HMDS), currently used as a coupling agent. In this particular case, the module previously used to deposit the coupling agent may be used as a neutralization chamber. The neutralization step is for example carried out at ambient temperature and for example lasts from 20 to 40 seconds, for example, 30 seconds.

After the neutralization step, the resist is developed (step S5). The resist development may be performed according to one or the other of the alternatives illustrated in FIGS. 4A and 4B, respectively corresponding to FIGS. 2A and 2B.

The applicant has performed measurements of the resist patterns remaining on the upper surface of the wafer after development, in the case of a photolithography method comprising no neutralization step and in the case of a photolithography method comprising a neutralization step. The neutralization step has been carried out in a module currently used to deposit an HMDS coupling agent. The neutralization step has been carried out at ambient temperature and for 60 s, just after the step of heating after exposure.

The results of the measurements of the dimensional differences between the patterns formed in the resist and the mask patterns are indicated in the following table, for the smallest patterns of the mask, for example, squares having a 30-nm side length, and for waiting times ranging from 2 to 8 hours between the end of the step of heating after exposure and the beginning of the development step.

|  | With no neutralization step | | With a neutralization step | |
| --- | --- | --- | --- | --- |
| Waiting time | 2 hours | 8 hours | 2 hours | 8 hours |
| Dimensional difference | 1 nm | 2.5 nm | ≈0 | 1 nm |

Further, due to the neutralization of acid compounds after the step of heating after exposure, the resist is more mechanically stable than in the case of a photolithography method with no neutralization step, since the polymer chains always support the desired quantity of dissolution-inhibiting groups.

Although term "photolithography" has been used herein, it should be understood that the present disclosure applies to the case where the sensitizing radiation is non-photonic, for example, an electron flow.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A photolithography method, comprising:
   depositing, on an upper surface of a wafer, a chemically-amplified resist;
   exposing the resist to a sensitizing radiation through a mask, the exposing including generating acid compounds in exposed regions of the resist;

causing a first portion of the acid compounds to react with dissolution-inhibiting groups, the causing including heating the resist;

neutralizing a second portion of the acid compounds which have not reacted while heating the resist; and developing the resist, wherein the neutralizing is implemented within a short delay after heating as compared with a duration between an end of heating the resist and a beginning of developing the resist and the neutralizing is started within a period of no more than 15 minutes after ending the heating.

2. The method of claim 1, wherein the neutralizing is started within a period less than 3 minutes after ending the heating and lasts for from 10 seconds to 5 minutes.

3. The method of claim 1, wherein the neutralizing comprises placing the resist-coated wafer in an environment that includes vapors of an alkaline compound.

4. The method of claim 3, wherein the alkaline compound belongs to the group consisting of amines and compounds of silazane and silazane derivatives.

5. The method of claim 1, wherein the neutralizing includes taking the resist to a temperature less than a maximum temperature reached by the resist during the heating.

6. The method of claim 4, wherein the maximum temperature reached by the resist during the heating ranges between 80 and 90° C. and the neutralizing is carried out at ambient temperature.

7. The method of claim 1, wherein the depositing, exposing, causing, and developing are carried out under a protected atmosphere.

8. The method of claim 1, further comprising, before depositing the resist, depositing a coupling agent on the upper surface of the wafer.

9. The method of claim 8, wherein the coupling agent is hexamethyldisilazane.

10. The method of claim 1, wherein the neutralizing includes placing the resist-coated wafer in an environment that includes vapors of an alkaline compound within the period of no more than 15 minutes after ending the heating.

11. The method of claim 1, wherein the neutralizing is started within a period of no more than 3 minutes after ending the heating.

12. The method of claim 11, wherein the neutralizing includes placing the resist-coated wafer in an environment that includes vapors of an alkaline compound within the period of no more than 3 minutes after ending the heating.

* * * * *